US012628696B2

(12) United States Patent
Shin

(10) Patent No.: US 12,628,696 B2
(45) Date of Patent: May 12, 2026

(54) FILM PACKAGE AND PACKAGE MODULE INCLUDING THE SAME

(71) Applicant: SAMSUNG ELECTRONICS CO., LTD., Suwon-si (KR)

(72) Inventor: Narae Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 641 days.

(21) Appl. No.: 18/100,859

(22) Filed: Jan. 24, 2023

(65) Prior Publication Data

US 2023/0369265 A1 Nov. 16, 2023

(30) Foreign Application Priority Data

May 10, 2022 (KR) ......................... 10-2022-0056940

(51) Int. Cl.
*H01L 23/00* (2006.01)
*H01L 25/10* (2006.01)
(52) U.S. Cl.
CPC ............ *H01L 24/08* (2013.01); *H01L 25/105* (2013.01); *H01L 2224/02381* (2013.01); *H01L 2224/08112* (2013.01); *H01L 2924/15151* (2013.01); *H01L 2924/182* (2013.01)
(58) Field of Classification Search
CPC .............................. H01L 24/08; H01L 25/105
See application file for complete search history.

(56) References Cited

U.S. PATENT DOCUMENTS

| | | | | |
|---|---|---|---|---|
| 6,740,962 | B1 * | 5/2004 | Grigg .................. | G03F 7/70416 |
| | | | | 257/725 |
| 7,582,976 | B2 * | 9/2009 | Seko ................... | H01L 23/3185 |
| | | | | 257/734 |
| 8,154,120 | B2 | 4/2012 | Kang et al. | |
| 8,576,567 | B2 | 11/2013 | Katoh et al. | |
| 9,324,689 | B2 | 4/2016 | Qi et al. | |
| 9,922,921 | B2 * | 3/2018 | Jung ................... | H01L 23/4985 |
| 10,051,738 | B2 | 8/2018 | Park et al. | |
| 10,163,942 | B2 * | 12/2018 | Chung .................. | H01L 25/105 |
| 10,840,191 | B2 | 11/2020 | Jung et al. | |
| 11,089,682 | B2 | 8/2021 | Lee et al. | |
| 2007/0057360 | A1 * | 3/2007 | Lee ................... | H01L 23/49833 |
| | | | | 257/E23.047 |

(Continued)

FOREIGN PATENT DOCUMENTS

| | | | |
|---|---|---|---|
| CN | 110815392 | A | 2/2020 |
| KR | 10-2007-0029470 | A | 3/2007 |
| KR | 10-2148483 | B1 | 8/2020 |

*Primary Examiner* — Nathan W Ha
(74) *Attorney, Agent, or Firm* — Sughrue Mion, PLLC

(57) ABSTRACT

A film package includes a base film including peripheral regions on opposite ends of the base film in a width direction and extending in a lengthwise direction, an inner region between the peripheral regions and extending in the lengthwise direction, and sprocket holes provided on the peripheral regions at a regular interval in the lengthwise direction, and a unit film package provided on the base film and defined by a cut line, the unit film package including a mount region on the inner region and a connection region provided in the lengthwise direction from the mount region, the connection region extending from the inner region toward a location between the sprocket holes in the lengthwise direction.

18 Claims, 9 Drawing Sheets

(56) References Cited

U.S. PATENT DOCUMENTS

| | | | |
|---|---|---|---|
| 2010/0245299 A1 | 9/2010 | Han et al. | |
| 2020/0335429 A1* | 10/2020 | Okaue | H01L 24/08 |
| 2023/0005813 A1* | 1/2023 | Fujinaga | H10F 39/804 |
| 2023/0014646 A1* | 1/2023 | Matsumoto | H01L 24/80 |
| 2023/0048644 A1* | 2/2023 | Chen | H01L 25/0657 |
| 2024/0038640 A1* | 2/2024 | Miyazaki | H01L 23/296 |
| 2024/0234277 A1* | 7/2024 | Shin | H01L 23/49822 |

* cited by examiner

FIG. 1

FILM PACKAGE AND PACKAGE MODULE INCLUDING THE SAME

CROSS-REFERENCE TO RELATED APPLICATION

This application is based on and claims priority under 35 U.S.C § 119 to Korean Patent Application No. 10-2022-0056940, filed on May 10, 2022, in the Korean Intellectual Property Office, the disclosure of which is incorporated by reference herein in its entirety.

BACKGROUND

1. Field

Example embodiments of the present disclosure relate to a semiconductor package, and more particularly, to a chip-on-film (COF) package and a package module including the same.

2. Description of Related Art

A chip-on-film (COF) package technique has been developed to use a flexible film substrate in order to accommodate the recent trend toward smaller, thinner, and lighter electronic products. According to the COF package technique, a semiconductor chip may be directly flip-chip bonded to a film substrate and coupled through a short lead to an external circuit. The COF package may be applied to portable terminal devices such as a cellular phone and a personal digital assistant (PDA), laptop computers, or display panels.

SUMMARY

Some example embodiments of the present disclosure provide a compact-sized film package and a package module including the same.

Further, some example embodiments of the present disclosure provide a highly integrated film package and a package module including the same.

Further still, some example embodiments of the present disclosure provide a high-reliable film package and a package module including the same.

Additional aspects will be set forth in part in the description which follows and, in part, will be apparent from the description, or may be learned by practice of the presented embodiments.

According to an aspect of an example embodiment, a film package includes: a base film including: peripheral regions on opposite ends of the base film in a width direction of the base film and extending in a lengthwise direction of the base film; an inner region between the peripheral regions and extending in the lengthwise direction; and sprocket holes provided on the peripheral regions, the sprocket holes provided at a regular interval in the lengthwise direction; and a unit film package provided on the base film and defined by a cut line, the unit film package including a mount region on the inner region; and a connection region provided in the lengthwise direction from the mount region, the connection region extending from the inner region toward a location between the sprocket holes in the lengthwise direction.

According to an aspect of an example embodiment, a film package includes: a base film extending in a first direction; a semiconductor chip provided on the base film; pads provided on the base film and arranged in a second direction that intersects the first direction; and connection lines provided on the base film and connecting the semiconductor chip and the pads, wherein the base film includes sprocket holes that vertically penetrate the base film, the sprocket holes being provided on opposite ends of the base film in the second direction and arranged at a regular interval in the first direction, and wherein at least a portion of the pads is between a pair of sprocket holes from among the sprocket holes, the pair of sprocket holes being adjacent to each other in the first direction.

According to an aspect of an example embodiment, a package module including: a display device; and a unit film package electrically connected to the display device, wherein the unit film package includes: a film substrate including a mount region and a connection region provided in a first direction of the mount region; a semiconductor chip provided on the mount region of the film substrate; pads provided on the connection region of the film substrate and connected to the display device; and connection lines provided on the film substrate and connecting the semiconductor chip and the pads, wherein a first width of the connection region in a second direction is greater than a second width of the mount region in the second direction, wherein the second direction intersects the first direction, and wherein the first width is greater than about 43 mm and less than about 48 mm.

BRIEF DESCRIPTION OF THE DRAWINGS

The above and other aspects, features, and advantages of certain example embodiments of the present disclosure will be more apparent from the following description taken in conjunction with the accompanying drawings, in which:

FIG. 1 is a diagram of a film package according to an example embodiment;

DETAILED DESCRIPTION

The following will now describe a film package according to the present disclosure with reference to the accompanying drawings.

Figure 1:
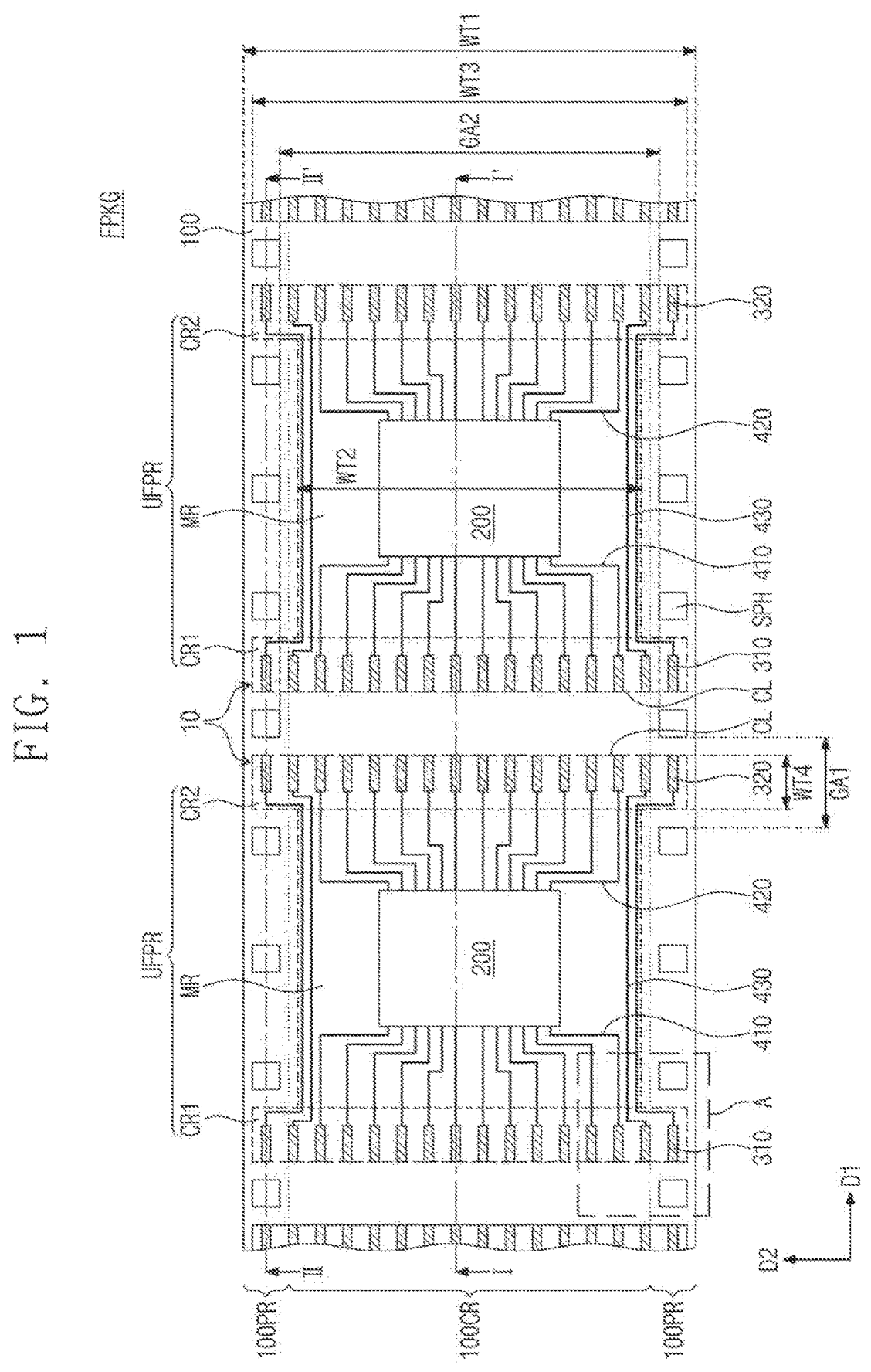
Figure 2:
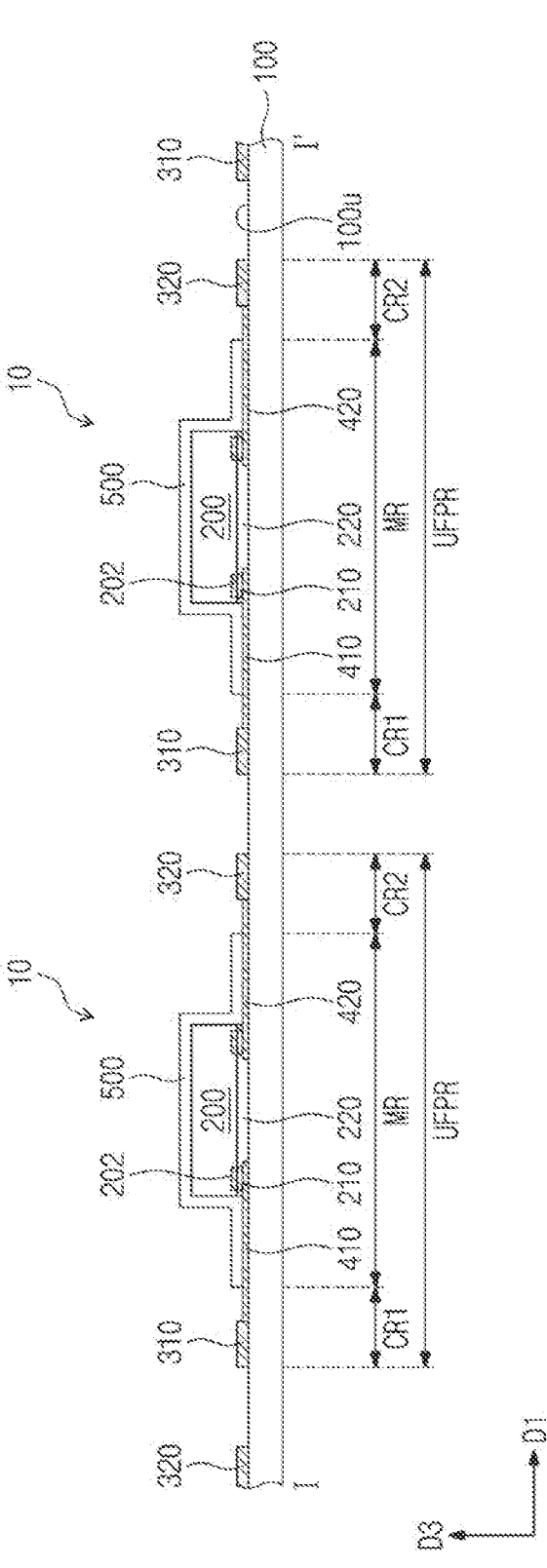
FIG. 2 is a cross-sectional view taken along line I-I' of FIG. 1, of a film package according to an example embodiment.
Figure 3:
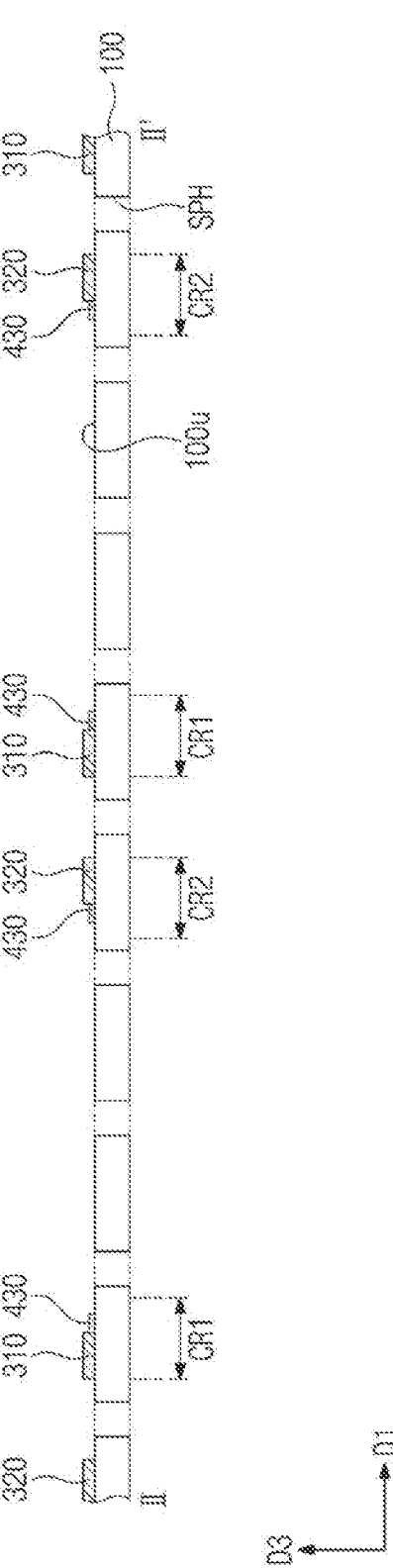
FIG. 3 is a cross-sectional view taken along line II-II' of FIG. 1, of a film package according to an example embodiment.
Figure 4:
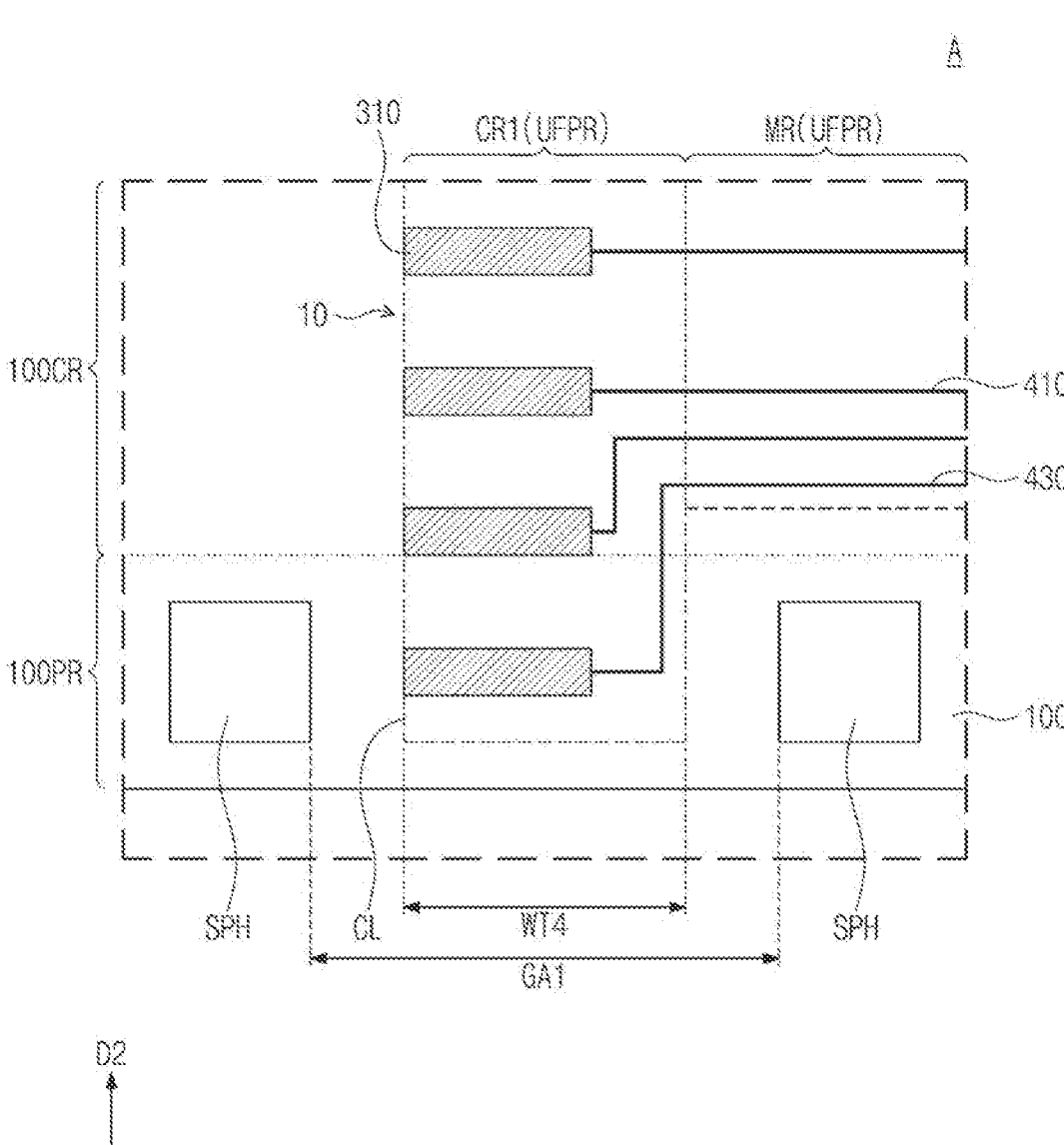
FIG. 4 is a diagram of section A of FIG. 1 according to an example embodiment.

FIG. 1 is a diagram of a film package according to an example embodiment. FIG. 2 is a cross-sectional view taken along line I-I' of FIG. 1, of a film package according to an example embodiment. FIG. 3 is a cross-sectional view taken along line II-II' of FIG. 1, of a film package according to an example embodiment. FIG. 4 is a diagram of section A of FIG. 1 according to an example embodiment. In FIG. 1, some components are illustrated transparently for convenience of description.

Referring to FIGS. 1, 2, and 3, a film package FPKG may include a film substrate 100, at least one semiconductor chip 200, first and second connection pads 310 and 320, and connection lines 410, 420, and 430.

The film substrate 100 may be provided. The film substrate 100 may be a base film on which the semiconductor chip 200, the first and second connection pads 310 and 320, and the connection lines 400 are provided. The film substrate 100 may extend in a first direction D1. In this description, the first direction D1 may be defined to indicate a lengthwise direction of the film substrate 100 parallel to a mount surface of the film substrate 100, and a second direction D2 may be defined to indicate a width direction of the film substrate 100 parallel to the mount surface of the film substrate 100. A first width WT1 of the film substrate 100 in the second direction D2 may range from about 35 mm to about 70 mm. For example, the first width WT1 of the film substrate 100 may range from about 43 mm to about 48 mm. In an example embodiment, the first width WT1 of the film substrate 100 may be about 35 mm, about 48 mm, or about 70 mm. For example, the first width WT1 of the film substrate 100 may be about 48.175 mm to about 69.95 mm Embodiments of the present disclosure, however, are not limited thereto, and the first width WT1 of the film substrate 100 may be variously changed in accordance with a required size of the film substrate 100 or a form factor of transfer equipment that transfers the film substrate 100. The film substrate 100 may include a polymeric material, for example, polyimide. The film substrate 100 may be flexible.

The film substrate 100 may have an inner region 100CR and peripheral regions 100PR.

When viewed in a plan view, the peripheral regions 100PR may be positioned on opposite sides of the film substrate 100 in the second direction D2, or on edges of the film substrate 100. The peripheral regions 100PR may extend in the first direction D1. For example, the peripheral regions 100PR may have a linear shape that extends along the edge of the film substrate 100. The peripheral regions 100PR may be zones where sprocket holes SPH are provided. The sprocket holes SPH may be arranged along the first direction D1 on the peripheral regions 100PR. The sprocket holes SPH may be arranged to constitute one row along the first direction D1 on one peripheral region 100PR. The sprocket holes SPH may constitute two, three, or more rows on one peripheral region 100PR. The sprocket holes SPH may have therebetween a constant interval GA1 in the first direction D1. The first interval GA1 between the sprocket holes SPH may range from about 3 mm to about 5 mm. For example, the first interval GA1 between the sprocket holes SPH may range from about 3.33 mm to about 4.75 mm. Embodiments of the present disclosure, however, are not limited thereto, and the first interval GA1 between the sprocket holes SPH may be variously changed in accordance with a form factor of transfer equipment that transfers the film substrate 100. The sprocket holes SPH may vertically penetrate through the film substrate 100 in a third direction D3. The third direction D3 may be a direction that is perpendicular to the film substrate 100 and intersects all of the first and second directions D1 and D2. The sprocket holes SPH may be used to wind or move the film substrate 100. For example, fins of the transfer equipment may be inserted into the sprocket holes SPH, and movement of the fins may drive the film substrate 100 to move in the first direction D1.

When viewed in a plan view, the inner region 100CR may be positioned between the peripheral regions 100PR in the second direction D2. For example, the peripheral regions 100PR may be spaced apart from each other across the inner region 100CR in the second direction D2. The inner region 100CR may have a linear shape that extends in the first direction D1. A width in the second direction D2 of the inner region 100CR may be greater than those of the peripheral regions 100PR. The inner region 100CR may be a zone where unit film packages 10 are provided. It is not limited that the unit film packages 10 are positioned only in the inner region 100CR, and portions of the unit film packages 10 may extend onto the peripheral regions 100RP. The unit film packages 10 may be arranged in the first direction D1.

The film substrate 100 may have zones defined by cut lines CL, and each of the unit film packages 10 may be provided on the zone defined by the cut lines CL. On the film package FPKG, the cut lines CL may be lines that define unit film package regions UFPR on the film substrate 100. The unit film package regions UFPR may be zones irrelevant to the peripheral regions 100PR and the inner region 100CR discussed above. For example, the unit film package regions UFPR may overlap the inner region 100CR, and portion of the unit film package regions UFPR may extend onto and overlap the peripheral regions 100PR. The unit film package regions UFPR may be arranged along the first direction D1.

The unit film packages 10 may include the unit film package regions UFPR of the film substrate 100 and components on the film package regions UFPR. The following will focus on a single unit film package 10.

One unit film package 10 may be provided on one unit film package region UFPR. The unit film package regions UFPR may have a mount region MR and connection regions CR1 and CR2.

The mount region MR may be positioned on the inner region 100CR. When viewed in a plan view, the mount region MR may be provided between the peripheral regions 100PR. For example, the mount region MR may not overlap the peripheral regions 100PR. A second width WT2 of the mount region MR in the second direction D2 may be less than a second interval GA2 between the sprocket holes SPH that are adjacent to each other in the second direction D2. For example, the second width WT2 of the mount region MR in the second direction D2 may be less than the width in the second direction D2 of the inner region 100CR. In this configuration, the mount region MR may not overlap the sprocket holes SPH. The mount region MR may be a zone on which is provided the semiconductor chip 200 which will be discussed below.

According to example embodiments of the present disclosure, as the mount region MR does not overlap the peripheral regions 100PR, when the film substrate 100 is delivered by transfer equipment, the semiconductor chip 200 and the connection lines 400 connected to the semiconductor chip 200 may be prevented from being damaged due to the transfer equipment (e.g., pins of the transfer equipment that are inserted into the sprocket holes SPH of the film substrate 100).

The connection regions CR1 and CR2 may be positioned on opposite sides of the mount region MR. For example, first connection regions CR1 may be connected to the mount region MR in a direction opposite to the first direction D1, and second connection regions CR2 may be connected to the mount region MR in the first direction D1. The second width WT2 of the mount region MR in the second direction D2 may be less than a third width WT3 of the first and second connection regions CR1 and CR2. Each of the first and second connection regions CR1 and CR2 may have a linear shape that extends in the second direction D2. For example, the first and second connection regions CR1 and CR2 may extend from the inner region 100CR onto the peripheral regions 100PR. In this configuration, the first and second connection regions CR1 and CR2 may overlap the inner region 100CR, and portions of the first and second connection regions CR1 and CR2 may extend onto the peripheral regions 100PR. Therefore, the unit film package regions UFRP may each have an H shape when viewed in a plan view. FIG. 1 depicts that the first connection region CR1 and the second connection region CR2 extend onto the peripheral region 100PR positioned on the inner region 100CR in the second direction D2 and onto the peripheral region 100PR positioned on the inner region 100CR in a direction opposite to the second direction D2, but the present disclosure are not limited thereto. According to example embodiments, the first connection region CR1 and the second connection region CR2 may extend onto only one of the peripheral region 100PR positioned on the inner region 100CR in the second direction D2 and the peripheral region 100PR positioned on the inner region 100CR in a direction opposite to the second direction D2. The following description will focus on the example embodiment of FIG. 1. The third width WT3 of the first and second connection regions CR1 and CR2 may be the same as or less than the first width WT1 of the film substrate 100.

The third width WT3 of the first and second connection regions CR1 and CR2 in the second direction D2 may be greater than the width of the inner region 100CR in the second direction D2. For example, the third width WT3 of the first and second connection regions CR1 and CR2 may be greater than the second interval GA2 between the sprocket holes SPH that are adjacent to each other in the second direction D2. In this configuration, on the peripheral regions 100PR, the first connection region CR1 and the second connection region CR2 may be positioned between the sprocket holes SPH. A fourth width WT4 of the first and second connection regions CR1 and CR2 in the first direction D1 may be less than the first interval GA1 between the sprocket holes SPH that are adjacent to each other in the first direction D1. For example, neither the first connection region CR1 nor the second connection region CR2 may overlap the sprocket holes SPH. The fourth width WT4 of the first and second connection regions CR1 and CR2 may be about 0.15 times to about 0.90 times the first interval GA1 between the sprocket holes SPH that are adjacent to each other in the first direction D1. The fourth width WT4 of the first and second connection regions CR1 and CR2 may range from about 0.5 mm to about 3.3 mm. The first connection region CR1 and the second connection region CR2 may be zones where the connection pads 310 and 320 are provided.

According to example embodiments of the present disclosure, as the first connection region CR1 and the second connection region CR2 are provided not only on the inner region 100CR but also on the peripheral regions 100PR, the first connection region CR1 and the second connection region CR2 may have large areas.

When viewed in a plan view, the first connection region CR1 may have a tetragonal shape on the peripheral regions 100PR. For example, as shown in FIG. 4, the first connection region CR1 may have a rectangular planar shape that extends from the inner region 100CR toward the peripheral regions 100PR. For more detail, on the peripheral regions 100PR, the fourth width WT4 of the first connection region CR1 in the first direction D1 may be constant along the second direction D2.

FIG. 4 shows an example based on the first connection region CR1, but a planar shape of the second connection region CR2 may be the same as or similar to that of the first connection region CR1. For example, the second connection region CR2 may have a rectangular planar shape that extends from the inner region 100CR toward the peripheral regions 100PR. For more detail, on the peripheral regions 100PR, a width (or the fourth width WT4) in the first direction D1 of the second connection region CR2 may be constant along the second direction D2.

Referring back to FIGS. 1 to 4, the semiconductor chip 200 may be provided on a front surface 100u of the film substrate 100. The front surface may refer to a surface on which electronic elements are mounted, and the film substrate 100 may be provided thereon with wiring lines and/or pads for mounting and/or connecting the electronic elements. Alternatively, the film substrate 100 may be provided on its front surface 100u with the wiring lines and/or the pads without the electronic elements. No electronic elements may be provided on a rear surface of the film substrate 100, which rear surface stands opposite to the front surface 100u. According to example embodiments, the film substrate 100 may be provided on its rear surface with only the wiring lines and/or the pads, or with the electronic elements together with the wiring lines and/or the pads.

The following description will focus on the example embodiment of FIGS. 1 to 3. The semiconductor chip 200 may be provided on the mount region MR of the unit film package region UFPR. The semiconductor chip 200 may be disposed in a face-down state on the film substrate 100. For example, an active surface of the semiconductor chip 200 may be directed toward the film substrate 100. For more detail, the semiconductor chip 200 may have chip pads 202 provided on its surface directed toward the film substrate 100.

FIGS. 1 to 3 depict that one semiconductor chip 200 is provided on one mount region MR, but the present disclosure are not limited thereto. According to example embodiments, a plurality of semiconductor chips 200 may be provided on one mount region MR.

The connection lines 410, 420, and 430 may be disposed on the front surface 100u of the film substrate 100. The connection lines 410, 420, and 430 may include first connection lines 410 and second connection lines 420. The first connection lines 410 may extend along a direction opposite to the first direction D1 from the semiconductor chip 200 to the first connection region CR1. The semiconductor chip 200 may have one side in a direction opposite to the first direction D1, and the first connection lines 410 may be spaced apart in the second direction D2 from each other on the one side of the semiconductor chip 200. The second connection lines 420 may extend along the first direction D1 from the semiconductor chip 200 to the second connection region CR2. The second connection lines 420 may be spaced apart in the second direction D2 from each other on one side in the first direction D1 of the semiconductor chip 200. An interval between the first connection lines 410 on the first connection region CR1 and an interval between the second connection lines 420 on the second connection region CR2 may be less than an interval between the first connection lines 410 below the semiconductor chip 200 and an interval between the second connection lines 420 below the semiconductor chip 200. For example, an interval between the first connection lines 410 may increase in a direction from the semiconductor chip 200 toward the first connection region CR1, and an interval between the second connection lines 420 may increase in a direction from the semiconductor chip 200 toward the second connection region CR2. One of an interval between the first connection lines 410 and an interval between the second connection lines 420 may be uniform on the mount region MR and the connection regions CR1 and CR2.

At least one of the connection lines 410, 420, and 430 may not be connected to the semiconductor chip 200. The connection lines 410, 420, and 430 may include third connection lines 430. The third connection lines 430 may be positioned in the second direction D2 or its opposite direction from the semiconductor chip 200. The third connection lines 430 may be horizontally spaced apart from the first connection lines 410 and the second connection lines 420. The third connection lines 430 may directly connect the first connection pads 310 to the second connection pads 320 which will be discussed below.

The film substrate 100 may be provided thereon with the semiconductor chip 200 mounted on the first connection lines 410 and the second connection lines 420. For example, portions of the first and second connection lines 410 and 420 may overlap the semiconductor chip 200. As shown in FIGS. 2 and 3, the portions of the first and second connection lines 410 and 420 may extend below the semiconductor chip 200. For example, the portions of the first and second connection lines 410 and 420 may vertically overlap the chip pads 202. Chip terminals 210 may be provided between the chip pads 202 and the portions of the first connection lines 410 and between the chip pads 202 and the portions of the second connection lines 420. The semiconductor chip 200 may be electrically connected through the chip terminals 210 to the first connection lines 410 and the second connection lines 420. The chip terminals 210 may be at least one of solders, pillars, and bumps. The chip terminals 210 may include metal.

An under-fill layer 220 may be formed to fill a gap between the film substrate 100 and the semiconductor chip 200. The under-fill layer 220 may encapsulate the chip terminals 210. The under-fill layer 220 may include a dielectric polymer, such as an epoxy-based polymer.

The connection pads 310 and 320 may be provided on the front surface 100u of the film substrate 100. The connection pads 310 and 320 may be provided on the first connection region CR1 and the second connection region CR2. The connection pads 310 and 320 may include first connection pads 310 provided on the first connection region CR1 and second connection pads 320 provided on the second connection region CR2. The first connection pads 310 may be arranged on the first connection region CR1 in the second direction D2. For example, the first connection region CR1 may have one end in a direction opposite to the first direction D1, and the first connection pads 310 may be arranged along the one end of the first connection region CR1. FIG. 1 depicts that the first connection pads 310 are in contact with the one end in a direction opposite to the first direction D1 of the first connection region CR1, but the present disclosure are not limited thereto. The first connection pads 310 may be spaced apart from the one end of the first connection region CR1 in a direction opposite to the first direction D1. The second connection pads 320 may be arranged on the second connection region CR2 in the second direction D2. For example, the second connection pads 320 may be arranged along one end of the second connection region CR2 in the first direction D1. FIG. 1 depicts that the second connection pads 320 are in contact the one end in the first direction D1 of the second connection region CR2, but the present disclosure are not limited thereto. The second connection pads 320 may be spaced apart from the one end of the second connection region CR2 in the first direction D1.

The first connection region CR1 and the second connection region CR2 may be positioned between the sprocket holes SPH, and at least one of the first connection pads 310 and at least one of the second connection pads 320 may be positioned between the sprocket holes SPH. The first connection pads 310 and the second connection pads 320 may be pads that electrically connect the unit film packages 10 to an external device when the film substrate 100 is separated from the unit film packages 10.

In general, the unit film package regions UFPR may be provided in the inner region 100CR of the film substrate 100. In this case, a small number of the connection pads 310 and 320 provided on connection areas of the unit film package regions UFPR. For example, when it is intended to form the unit film packages 10 having a large number of connection pads 310 and 320, the film substrate 100 whose width WT1 is large may be needed.

According to example embodiments of the present disclosure, the first connection pads 310 and the second connection pads 320 may be provided not only on the inner region 100CR but also on the peripheral regions 100PR. In such a configuration, a large number of the first connection pads 310 and the second connection pads 320 may be arranged along the second direction D2. Thus, there may be provided not only the film package FPKG having the unit film packages 10, but also the film package FPKG having the small width WT1.

In addition, because the unit film package regions UFPR overlap the peripheral regions 100PR while being spaced apart from the sprocket holes SPH, the unit film packages 10 may be prevented from being damaged due to transfer equipment for transferring the film package FPKG. Moreover, because the sprocket holes SPH are provided at a uniform interval, there may be excellent compatibility between the film package FPKG and the transfer equipment.

Referring to FIGS. 1 to 4, the first connection pads 310 and the second connection pads 320 may be electrically connected to the semiconductor chip 200. For example, the first connection pads 310 may be connected through the first connection lines 410 to the semiconductor chip 200, and the second connection pads 320 may be connected through the second connection lines 420 to the semiconductor chip 200. Ones of the first connection pads 310 and ones of the second connection pads 320 may be directly connected through the third connection lines 430. As shown in FIG. 1, the connection lines 410, 420, and 430 may be curved. Embodiments of the present disclosure, however, are not limited thereto, and the connection lines 410, 420, and 430 may be provided in various shapes in accordance with an arrangement of the first and second connection pads 310 and 320, a size of the semiconductor chip 200, and an arrangement of the chip pads 202 of the semiconductor chip 200.

A protection layer may be provided on the first connection line 410 and the second connection line 420. The protection layer may cover and protect the first connection line 410 and the second connection line 420. The protection layer may include a dielectric material. For example, the protection layer may include a solder resist material.

A protection film 500 may be provided on the film substrate 100. The protection film 500 may be attached to the film substrate 100 to cover the semiconductor chip 200 and the protection layer. The protection film 500 may physically contact the protection layer and top and lateral surfaces of the semiconductor chip 200, and may encapsulate the semiconductor chip 200. The protection film 500 may expose the first connection pads 310 and the second connection pads 320. The protection film 500 may include a dielectric polymer. The dielectric polymer may include at least one selected from polyimide, polyethylene terephthalate (PET), and polyethylene naphthalate (PEN). Alternatively, the protection film 500 may include a material whose conductivity is high. The term "conductivity" may refer to at least one selected from thermal conductivity and electric conductivity. The protection film 500 may include metal such as one or more of aluminum (Al) and copper (Cu), or a carbon-containing material such as one or more of graphene, carbon nano-tube, and graphite. In this case, the protection film 500 may be electrically insulated through the protection layer from the first connection line 410 and the second connection line 420. The protection film 500 may be attached through an adhesion film to the film substrate 100 or the protection layer. The adhesion film may include an epoxy-based polymer, an acrylic polymer, and silicon-containing material.

Figure 5:
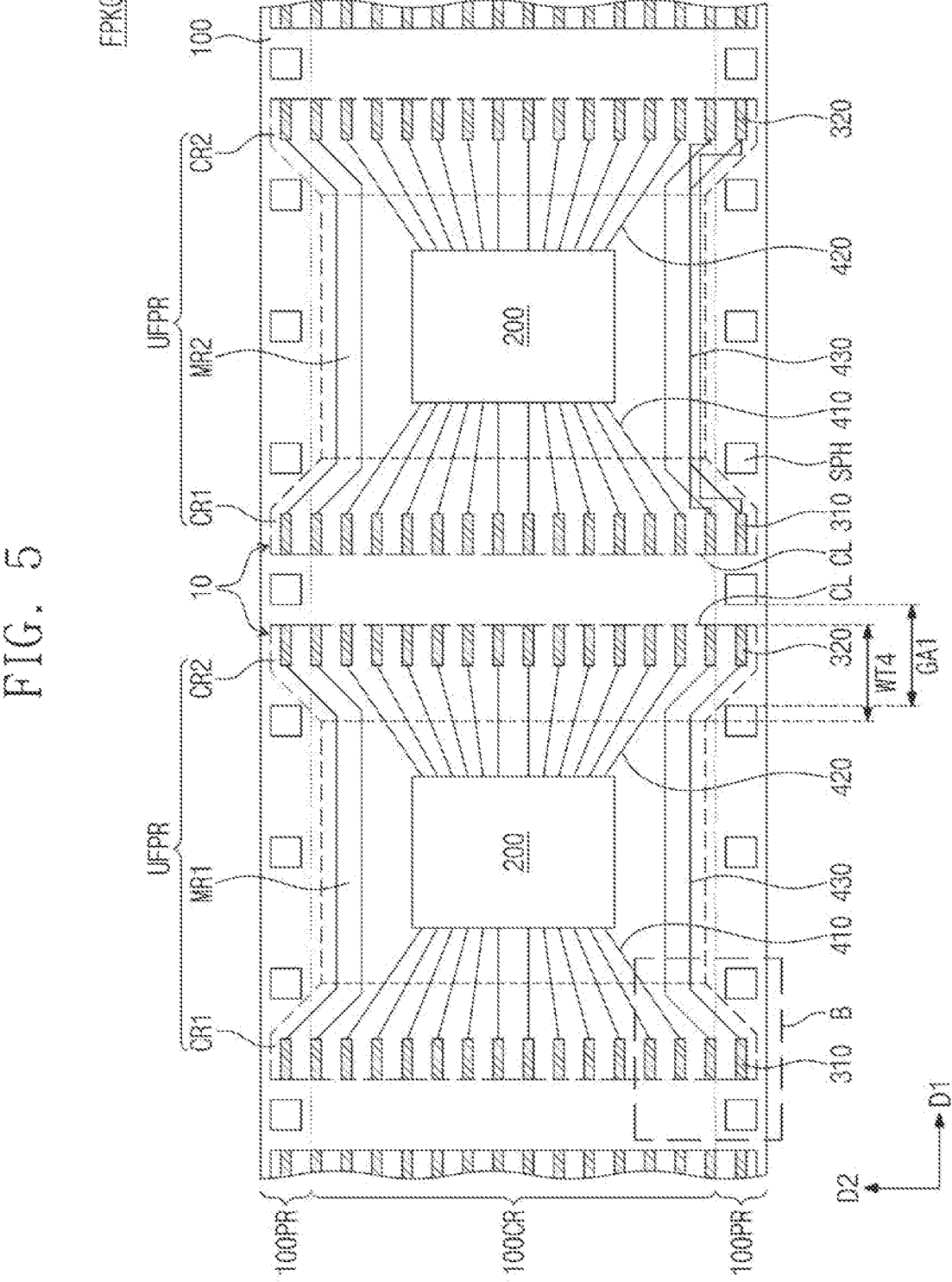
FIG. 5 is a diagram of a film package according to an example embodiment.
Figure 6:
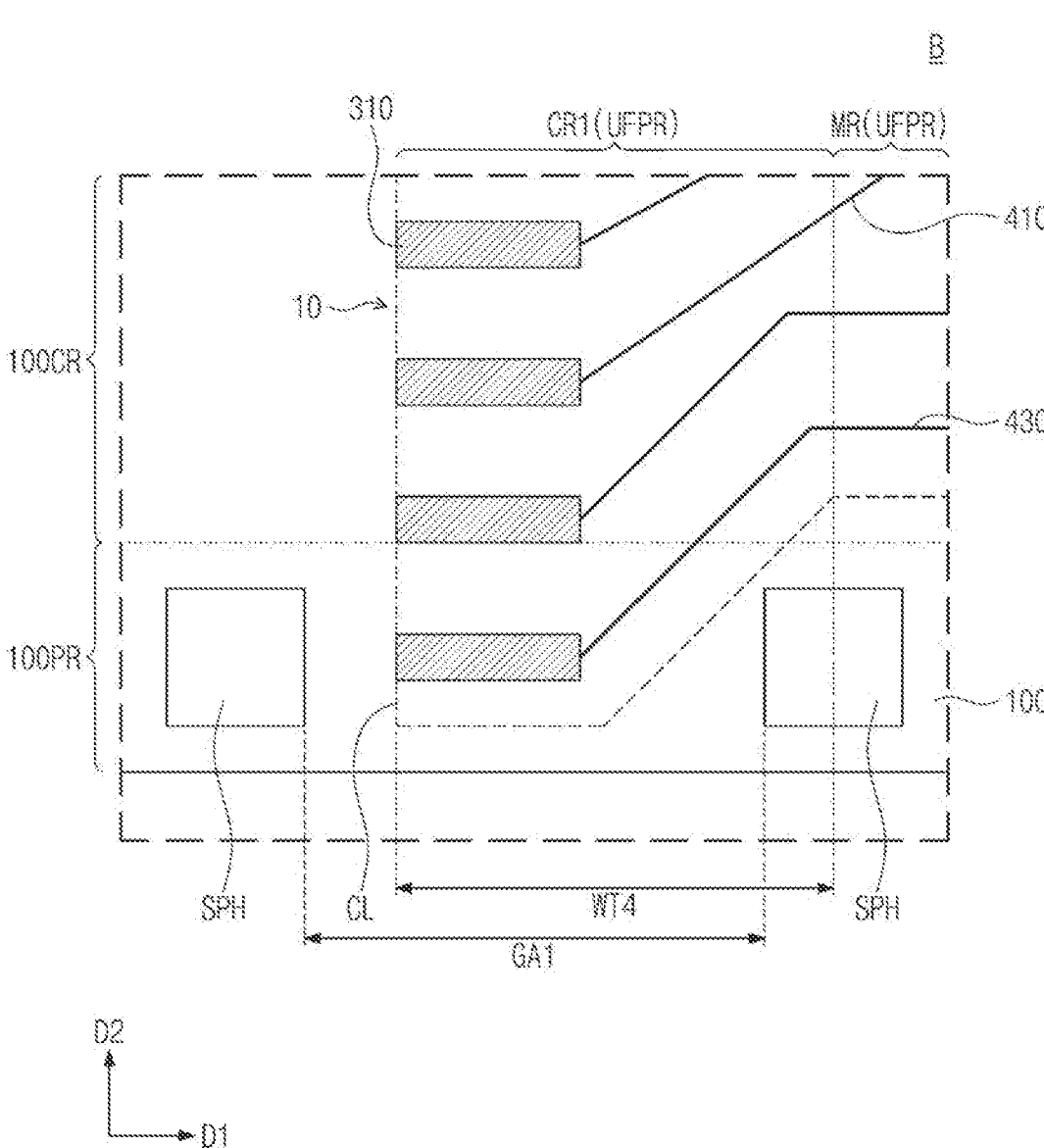
FIGS. 6 and 7 are diagrams of section B of FIG. 5 according to an example embodiment.
Figure 7:
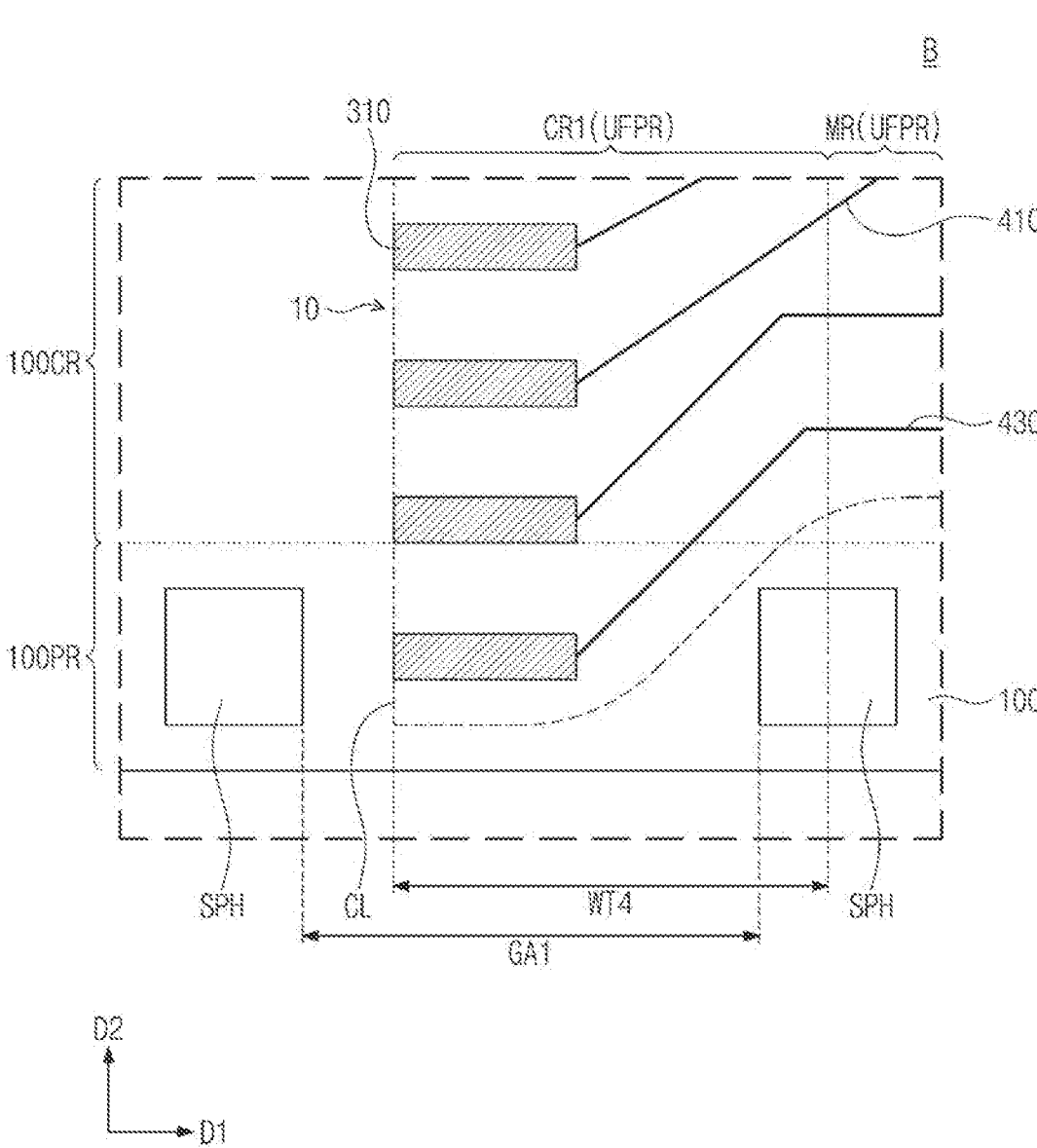

FIG. 5 is a diagram of a film package according to an example embodiment. FIGS. 6 and 7 are diagrams of section B of FIG. 5 according to an example embodiment. A detailed description of technical features repetitive to those discussed with reference to FIGS. 1 to 4 will be omitted for convenience of description, and a difference thereof will be discussed in detail. The same reference numerals will be allocated to the components the same as or similar to those of the semiconductor package discussed above.

Referring to FIG. 5, when viewed in a plan view, on the peripheral regions 100PR, the fourth width WT4 of the first region CR1 in the first direction D1 may be changed along the second direction D2. For example, the fourth width WT4 of the first connection region CR1 may decrease with increasing distance from the inner region 100CR.

As shown in FIG. 6, on the peripheral regions 100PR, the first connection region CR1 may have a trapezoidal shape when viewed in a plan view. For example, the fourth width WT4 of the first connection region CR1 may steadily decrease with distance from the inner region 100CR. The fourth width WT4 of the first and second connection regions CR1 and CR2 in the first direction D1 may be less than the first interval GA1 between the sprocket holes SPH that are adjacent to each other in the first direction D1. The first connection region CR1 may have a portion positioned on the peripheral region 100PR, and the portion of the first connection region CR1 may be positioned between the sprocket holes SPH. The first connection region CR1 may not overlap the sprocket holes SPH.

According to example embodiments, as shown in FIG. 7, the first connection region CR1 may have a curved lateral surface on the peripheral region 100PR. For example, the fourth width WT4 of the first connection region CR1 may irregularly decrease with distance from the inner region 100CR. The fourth width WT4 of the first and second connection regions CR1 and CR2 in the first direction D1 may be less than the first interval GA1 between the sprocket holes SPH that are adjacent to each other in the first direction D1. The first connection region CR1 may have a portion positioned on the peripheral region 100PR, and the portion of the first connection region CR1 may be positioned between the sprocket holes SPH. The first connection region CR1 may not overlap the sprocket holes SPH.

FIGS. 6 and 7 show an example based on the first connection region CR1, but a planar shape of the second connection region CR2 may be the same as or similar to that of the first connection region CR1. For example, the second connection region CR2 may have a trapezoidal shape or a curved lateral surface on the peripheral region 100PR.

The planar shapes of the first and second connection regions CR1 and CR2 described with reference to FIGS. 6 and 7 correspond to an example embodiment, but the present disclosure are not limited thereto. The planar shapes of the first and second connection regions CR1 and CR2 may be variously changed in accordance with an arrangement of the first connection pads 310, an arrangement of the second connection pads 320, and an arrangement of the sprocket holes SPH. In this case, identically to example embodiments of the present disclosure, on the peripheral regions 100PR, the first connection region CR1 and the second connection region CR2 may be positioned between the sprocket holes SPH, and neither the first connection region CR1 nor the second connection region CR2 may overlap the sprocket holes SPH.

Figure 8:
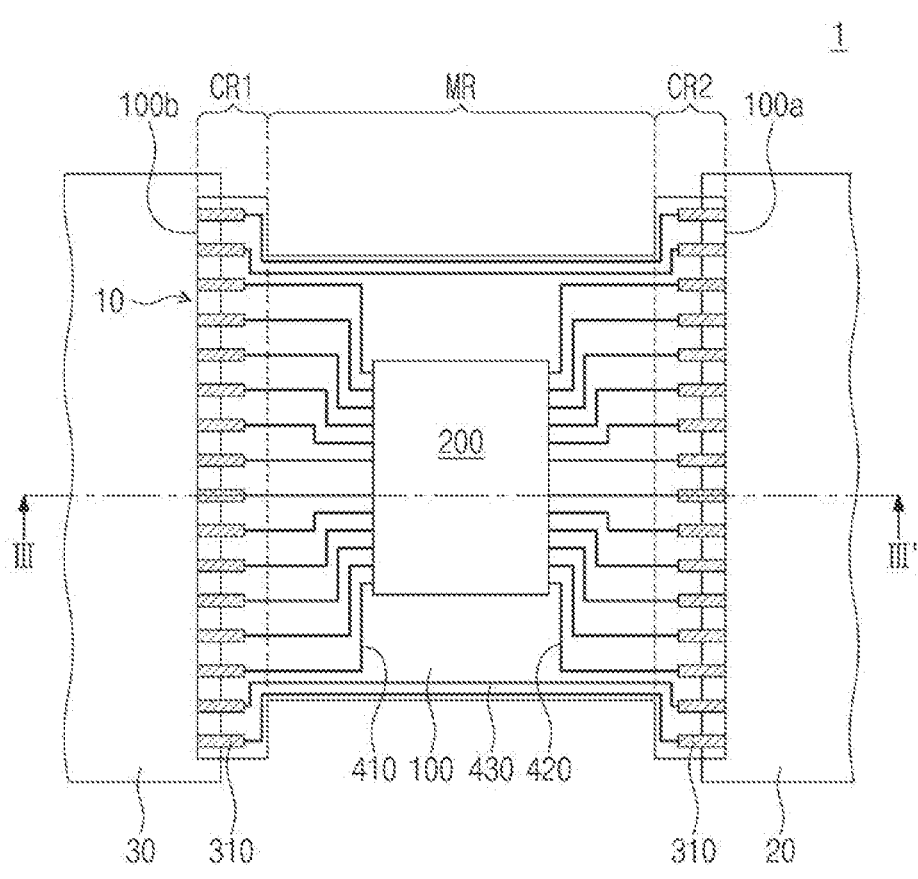
FIG. 8 is a diagram of a package module according to an example embodiment.
Figure 9:
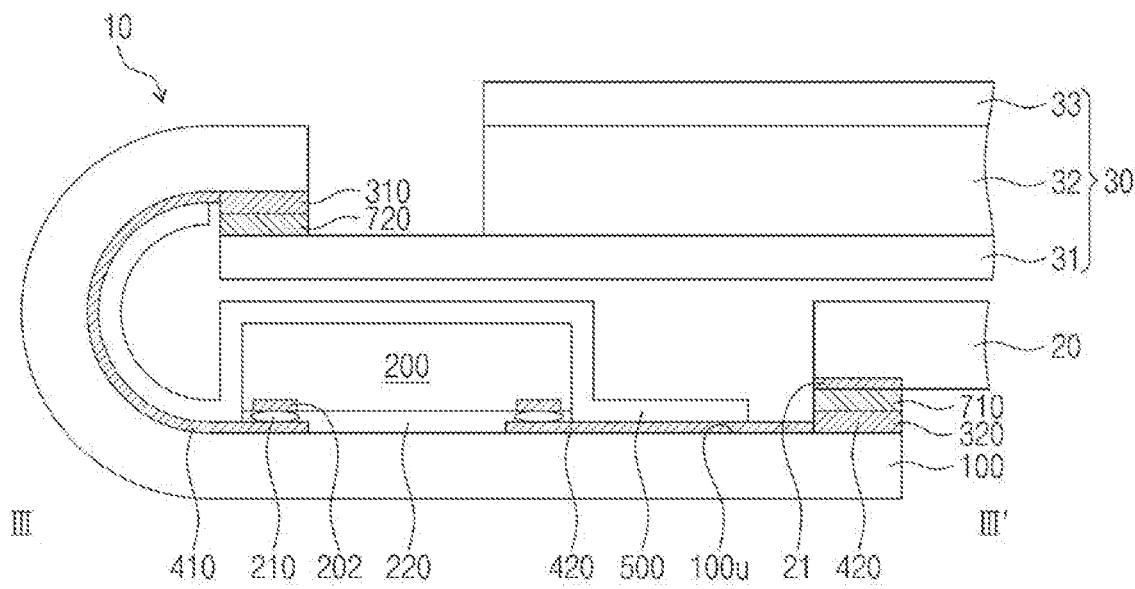
FIG. 9 illustrates a cross-sectional view taken along line III-III' of FIG. 8, showing a package module according to an example embodiment.

FIG. 8 is a diagram of a package module according to an example embodiment. FIG. 9 illustrates a cross-sectional view taken along line III-III' of FIG. 8, showing a package module according to an example embodiment.

Referring to FIGS. 8 and 9, a package module 1 may include a unit film package 10, a circuit board 20, and a display device 30. The package module 1 may be a display device assembly. The package module 1 may be fabricated by using the film package FPKG discussed with reference to FIGS. 1 to 7. Referring back to FIG. 1, the film package FPKG may be cut along the cut line CL, such that a plurality of unit film packages 10 may be separated from each other. The unit film packages 10 may include components on the unit film package regions UFPR of the film substrate 100. For example, each of the unit film packages 10 may include a film substrate 100, a semiconductor chip 200, first connection lines 410, second connection lines 420, first connection pads 310, second connection pads 320, and a protection film 500. On each of the unit film packages 10, an outer boundary of the film substrate 100 may correspond to the cut line CL. The unit film packages 10 may be fabricated by using the film package FPKG discussed with reference to FIGS. 5 to 7. The following will focus on a single unit film package 10.

The circuit board 20 and the display device 30 may be respectively mounted on a first end 100a and a second end 100b of the unit film package 10, with the result that the package module 1 may be fabricated. Based on FIG. 1, the first end 100a of the film substrate 100 may be an end of the film substrate 100 in the first direction D1, and the second end 100b of the film substrate 100 may be an end in a direction opposite to the first direction D1. For example, the film substrate 100 may be provided with the second connection pads 320 on its end that corresponds to the first end 100a, and may be provided with the first connection pads 310 on its end that corresponds to the second end 100b. As shown in FIG. 9, the film substrate 100 may be flexibly bent. For example, the semiconductor chip 200 may have a front surface 100u on which the semiconductor chip 200 is provided, and a portion of the front surface 100u may face another portion of the front surface 100u.

The circuit board 20 may be disposed on the front surface 100u of the film substrate 100. The circuit board 20 may be adjacent to the first end 100a of the film substrate 100. For example, a printed circuit board (PCB) or a flexible PCB (FPCB) may be used as the circuit board 20. The second connection pads 320 may be exposed by the protection film 500 and the protection layer discussed with reference to FIG. 1. Input connection parts 710 may be provided between the second connection pads 320 and pads 21 of the circuit board 20. The input connection parts 710 may include an aniso-tropic conductive film (ACF). Alternatively, the input connection parts 710 may include a solder ball or a solder bump. As shown in FIG. 9, the circuit board 20 may be electrically connected through the input connection parts 710 to the second connection pads 320. The circuit board 20 may be electrically connected to the semiconductor chip 200 through the second connection pads 320 and the second connection lines 420.

The display device 30 may be disposed on the front surface 100*u* of the film substrate 100. The display device 30 may be adjacent to the second end 100*b* of the film substrate 100. The display device 30 may include a display substrate 31, a display panel 32, and a protection part 33 that are stacked. Output connection parts 720 may be provided between the display substrate 31 and the first connection pads 310. The output connection parts 720 may include an ACF. Alternatively, the output connection parts 720 may include a solder ball or a solder bump. As shown in FIG. 9, the display substrate 31 may be electrically connected through the output connection parts 720 to the semiconductor chip 200. The display device 30 may be electrically connected to the semiconductor chip 200 through the first connection pads 310 and the first connection lines 410.

The semiconductor chip 200 may be supplied with signals through the second connection lines 420 from the circuit board 20. The semiconductor chip 200 may include drive integrated circuits (e.g., a gate drive integrated circuit and/or a data drive integrated circuit), and may generate drive signals (e.g., a gate drive signal and/or a data drive signal). The drive signals generated from the semiconductor chip 200 may be supplied through the first connection lines 410 to a gate line and/or a data line of the display substrate 31. Therefore, the display panel 32 may operate. According to example embodiments, a plurality of semiconductor chips 200 may be provided.

A film package according to example embodiments of the present disclosure may be configured such that connection pads may be provided not only on an inner region but also on peripheral regions on which sprocket holes are arranged. Therefore, a large number of the connection pads may be arranged along a width direction of a base film. For example, there may be not only provided a film package having unit film packages whose integration is increased, a package module including the film package, but also provided a film package having a narrow width and a compact-sized package module.

In addition, because unit film package regions are spaced apart from sprocket holes while overlapping peripheral regions, the unit film packages may be prevented from being damaged due to transfer equipment for transferring the film package. Moreover, because the sprocket holes are provided at a uniform interval, there may be excellent compatibility between the film package and the transfer equipment.

Although the disclosure been described in connection with some example embodiments illustrated in the accompanying drawings, it will be understood by one of ordinary skill in the art that variations in form and detail may be made therein without departing from the spirit and essential feature of the disclosure. The above disclosed example embodiments should thus be considered illustrative and not restrictive.

What is claimed is:
1. A film package comprising:
a base film comprising:
peripheral regions on opposite ends of the base film in a width direction of the base film and extending in a lengthwise direction of the base film;
an inner region between the peripheral regions and extending in the lengthwise direction; and sprocket holes provided on the peripheral regions, the sprocket holes provided at a regular interval in the lengthwise direction; and
a unit film package provided on the base film and defined by a cut line, the unit film package comprising:
a mount region on the inner region;
a connection region provided in the lengthwise direction from the mount region, the connection region extending from the inner region into at least one peripheral region of the peripheral regions and toward a location between the sprocket holes in the lengthwise direction, and
at least one pad in the connection region, in the at least one peripheral region, and between the sprocket holes.
2. The film package of claim 1, wherein a first width of the mount region in the width direction is less than a second width of the connection region in the width direction, and
wherein the second width is less than or equal to a third width of the base film in the width direction.
3. The film package of claim 2, wherein the unit film package has an H shape.
4. The film package of claim 2, wherein the mount region does not overlap the peripheral regions, and
wherein the connection region does not overlap the inner region.
5. The film package of claim 1, wherein a fourth width of the connection region in the lengthwise direction is less than a first interval between the sprocket holes in the lengthwise direction.
6. The film package of claim 5, wherein the fourth width is about 0.15 times to about 0.90 times the first interval.
7. The film package of claim 5, wherein the fourth width of the connection region is constant on the peripheral regions.
8. The film package of claim 5, wherein, on the peripheral regions, the fourth width of the connection region decreases as a distance of the connection region from the inner region increases.
9. The film package of claim 1, wherein a first width of the mount region in the width direction is less than a second interval between the sprocket holes in the width direction, and
a second width of the connection region in the width direction of is greater than the second interval between the sprocket holes in the width direction.
10. The film package of claim 1, wherein the unit film package does not overlap the sprocket holes.
11. The film package of claim 1, wherein the unit film package further comprises:
a semiconductor chip provided on the mount region of the unit film package;
pads provided on the connection region of the unit film package and arranged in the width direction, the pads comprising the at least one pad; and
connection lines through which the semiconductor chip and the pads are connected on the base film.
12. A film package comprising:
a base film extending in a first direction, the base film comprising peripheral regions extending in the first direction and on opposite ends of the base film in a second direction that intersects the first direction;
a semiconductor chip provided on the base film;
pads provided on the base film, the pads being disposed on one side in the first direction of the semiconductor chip and arranged in the second direction; and

connection lines provided on the base film and connecting the semiconductor chip and the pads, wherein the base film comprises sprocket holes that vertically penetrate the base film, the sprocket holes being provided on opposite ends of the base film in the second direction and arranged at a regular interval in the first direction, and wherein at least a portion of the pads is in at least one peripheral region of the peripheral regions and between a pair of sprocket holes from among the sprocket holes, the pair of sprocket holes being adjacent to each other in the first direction.

13. The film package of claim 12, wherein the base film further comprises:

an inner region between the peripheral regions and extending in the first direction, wherein the semiconductor chip is provided on the inner region, and wherein the sprocket holes are provided in the peripheral regions.

14. The film package of claim 12, further comprising a unit film package defined by a cut line on the base film, the unit film package comprising the semiconductor chip, the pads, and the connection lines.

15. The film package of claim 14, wherein the unit film package further comprises:

a mount region on which the semiconductor chip is mounted; and a connection region on which the pads are provided and having a linear shape extending in the second direction, the connection region being provided in the first direction, and wherein at least a portion of the connection region is positioned between the pair of sprocket holes.

16. The film package of claim 15, wherein a first width in the first direction of the connection region is about 0.15 times to about 0.90 times an interval between the pair of sprocket holes.

17. The film package of claim 15, wherein a second width of the mount region in the second direction is less than a third width of the connection region in the second direction, and wherein the third width is less than or equal to a fourth width of the base film in the second direction.

18. The film package of claim 14, wherein the unit film package does not overlap the sprocket holes.

* * * * *